(12) United States Patent
Jin

(10) Patent No.: US 12,469,734 B2
(45) Date of Patent: Nov. 11, 2025

(54) CERAMIC SUSCEPTOR

(71) Applicant: MiCo Ceramics Ltd., Anseong-si (KR)

(72) Inventor: Jung-Chul Jin, Anseong-si (KR)

(73) Assignee: MiCo Ceramics Ltd., Anseong-si (KR)

( * ) Notice: Subject to any disclaimer, the term of this patent is extended or adjusted under 35 U.S.C. 154(b) by 0 days.

(21) Appl. No.: 18/979,782

(22) Filed: Dec. 13, 2024

(65) Prior Publication Data

US 2025/0210396 A1 Jun. 26, 2025

(30) Foreign Application Priority Data

Dec. 21, 2023 (KR) .................. 10-2023-0187816

(51) Int. Cl.
*H01L 21/683* (2006.01)
*H01T 23/00* (2006.01)

(52) U.S. Cl.
CPC .............................. *H01L 21/6833* (2013.01)

(58) Field of Classification Search
CPC .................................................. H01L 21/6833
USPC ........................................................ 361/234
See application file for complete search history.

(56) References Cited

U.S. PATENT DOCUMENTS

| | | |
|---|---|---|
| 11,395,377 B2 | 7/2022 | Park et al. |
| 11,469,129 B2 | 10/2022 | Takahashi |
| 2003/0051665 A1 | 3/2003 | Zhao et al. |
| 2003/0089600 A1 | 5/2003 | Natsuhara et al. |
| 2005/0028739 A1 | 2/2005 | Natsuhara et al. |
| 2006/0267494 A1 | 11/2006 | Tomita et al. |
| 2008/0116187 A1* | 5/2008 | Sugimoto .............. H05B 3/143 219/200 |
| 2009/0107635 A1 | 4/2009 | Kano et al. |
| 2013/0126206 A1 | 5/2013 | Zhou et al. |
| 2014/0041435 A1 | 2/2014 | Cha |
| 2016/0002766 A1 | 1/2016 | Cha et al. |
| 2016/0049323 A1 | 2/2016 | Ye et al. |
| 2016/0251265 A1* | 9/2016 | Takahashi .......... H01L 21/6833 361/234 |
| 2017/0204514 A1 | 7/2017 | Kim et al. |

(Continued)

FOREIGN PATENT DOCUMENTS

CN 101740183 A 6/2010
EP 2071610 A2 6/2009

(Continued)

OTHER PUBLICATIONS

Kim, Hoe-Geun et al., "Effect of Various Interlayer Deposition on Room Temperature and High Temperature Properties of CrAIN Coatings", Proceedings of the Korean Institute of Surface Engineering Conference, 2017.

(Continued)

*Primary Examiner* — Rexford N Barnie
*Assistant Examiner* — Lucy M Thomas
(74) *Attorney, Agent, or Firm* — NKL Law; Jae Youn Kim

(57) ABSTRACT

The present disclosure relates to a ceramic susceptor including a ceramic plate having an electrode disposed thereon, wherein the ceramic plate may include an electrode pad connected to the electrode and an electrode rod having one end connected to the electrode pad to supply power to the electrode, and the electrode rod may include an extension part connected to the electrode pad and a power connection part provided at an end of a tapered portion of the extension part.

11 Claims, 13 Drawing Sheets

(56) References Cited

U.S. PATENT DOCUMENTS

| | | | |
|---|---|---|---|
| 2017/0278682 A1 | 9/2017 | Lin et al. | |
| 2017/0278732 A1* | 9/2017 | Amano | H01L 21/68792 |
| 2021/0100072 A1 | 4/2021 | Park et al. | |
| 2022/0030669 A1 | 1/2022 | Aikawa et al. | |
| 2022/0122875 A1 | 4/2022 | Li et al. | |
| 2022/0238316 A1 | 7/2022 | Lee et al. | |
| 2022/0254670 A1 | 8/2022 | Parkhe et al. | |
| 2023/0058637 A1* | 2/2023 | Unno | H01L 21/68785 |

FOREIGN PATENT DOCUMENTS

| | | | |
|---|---|---|---|
| JP | 2002-025913 | A | 1/2002 |
| JP | 2002-509989 | A | 4/2002 |
| JP | 2003-160874 | A | 6/2003 |
| JP | 2005-063991 | A | 3/2005 |
| JP | 2008-305968 | A | 12/2008 |
| JP | 2020-516043 | A | 5/2020 |
| KR | 20100050388 | A | 5/2010 |
| KR | 20140019673 | A | 2/2014 |
| KR | 20140097312 | A | 8/2014 |
| KR | 101465640 | B1 | 11/2014 |
| KR | 20160005150 | A | 1/2016 |
| KR | 20170042359 | A | 4/2017 |
| KR | 20180117436 | A | 10/2018 |
| KR | 20180121662 | A | 11/2018 |
| KR | 102254204 | B1 | 5/2021 |
| KR | 20210139368 | A | 11/2021 |
| KR | 20220147395 | A | 11/2022 |
| KR | 20220166861 | A | 12/2022 |
| KR | 20230118342 | A | 8/2023 |
| TW | 202224092 | | 6/2022 |
| TW | 202240645 | A | 10/2022 |
| TW | 202316559 | A | 4/2023 |
| WO | 2022-145668 | A1 | 7/2022 |
| WO | 2022-209619 | A1 | 10/2022 |

OTHER PUBLICATIONS

Gwang Seok Kim et al., "Microstructure and mechanical properties of AlCrN films deposited by CFUBMS", Surface & Coatings Technology 201, 2006, pp. 4361-4366.

* cited by examiner

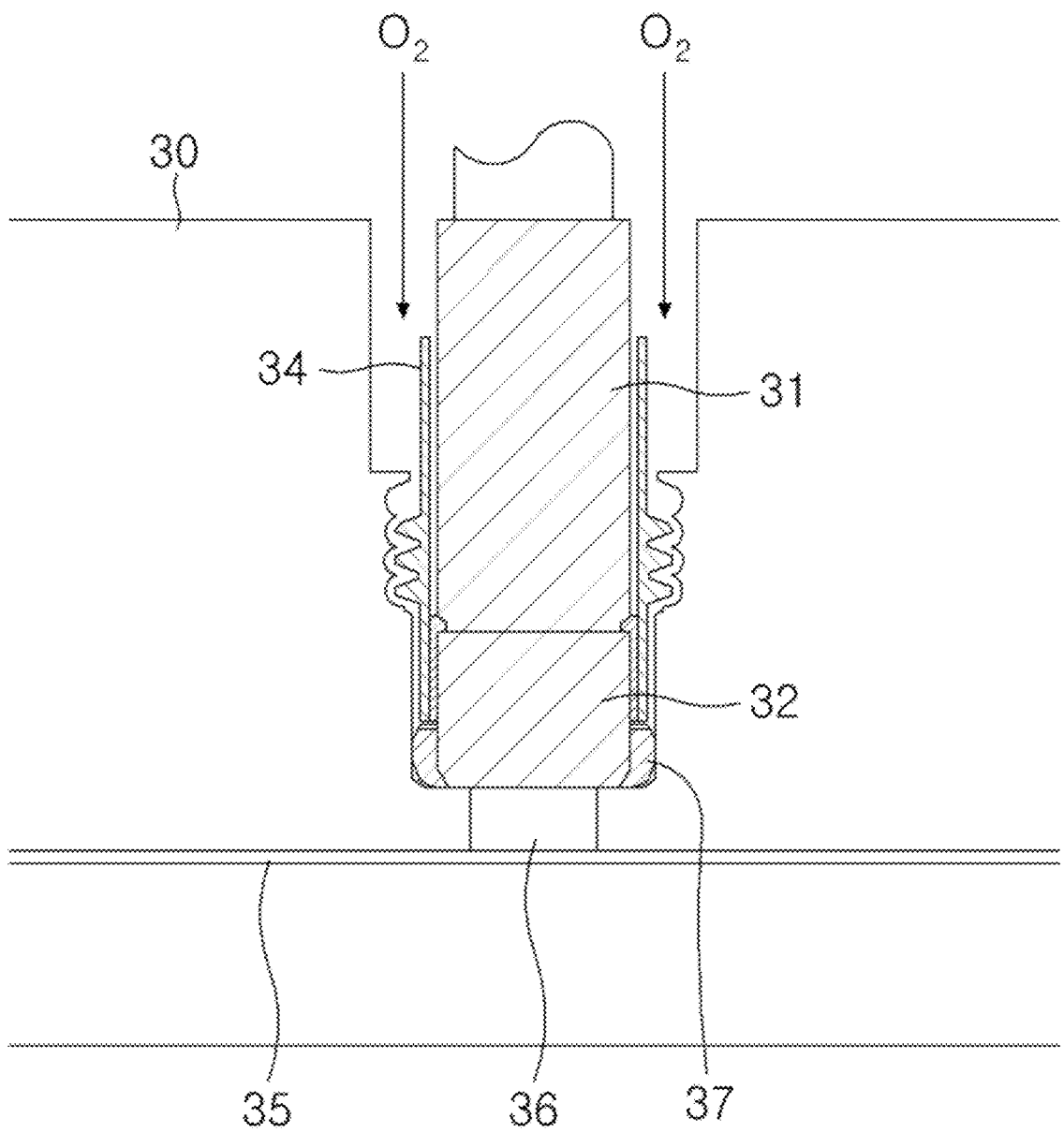

CERAMIC SUSCEPTOR

CROSS-REFERENCE TO RELATED APPLICATION(S)

This application is based on and claims priority under 35 U.S.C. 119 to Korean Patent Application No. 10-2023-0187816, filed on Dec. 21, 2023, in the Korean Intellectual Property Office, the disclosure of which is herein incorporated by reference in its entirety.

BACKGROUND OF THE INVENTION

1. Field of the Invention

The present disclosure relates to a susceptor and, particularly, to a ceramic-based susceptor to which an electrode rod material for reducing impedance is applied.

In addition, the present disclosure relates to a susceptor and, particularly, to a ceramic susceptor in which the durability of an electrode rod is improved.

2. Description of the Prior Art

In general, semiconductor devices or display devices are manufactured by sequentially stacking a plurality of thin film layers including dielectric layers and metal layers on a glass substrate, a flexible substrate, or a semiconductor wafer substrate, and then performing patterning. In this semiconductor manufacturing process, a susceptor is used as a support structure for supporting the substrate. Susceptors are widely used in a plasma deposition process or the like for a precise process, such as wiring miniaturization of a semiconductor device, to meet the requirements for precise temperature control and heat treatment, and are also used for forming plasma or heating a substrate in an etching process of thin film layers formed on a semiconductor wafer substrate.

FIG. 1 illustrates an electrode part of a susceptor of the related art. Referring to FIG. 1, the susceptor of the related art has a conductive pad 36 inside a ceramic plate 30 to enable connection with electrode rods 31, 32. In the ceramic plate 30, an RF electrode 35 having various two-dimensional shapes, such as a circle or a crescent shape, is embedded, and the conductive pad 36 to be electrically connected to the RF electrode 35 is also embedded.

An eyelet-shaped support 34 that accommodates the electrode rods 31, 32 therein is screw-coupled to the ceramic plate 30 through screw threads formed in the opening of the ceramic plate. At this time, a brazing filler 37 may be provided between the upper electrode rod 31 and the lower electrode rod 32 and between the lower electrode rod 32 and the conductive pad 36, and the brazing filler 37 may electrically connect the electrode rods 31, 32 and the RF electrode 35 by brazing. In the susceptor of the related art, the gap between the support 34 and the lower electrode rod 32 or the gap between the support 34 and the ceramic plate 30 may act as a path through which oxygen may penetrate in a high-temperature atmosphere, thereby oxidizing the upper electrode rod 31 and the lower electrode rod 32. Such oxidation may reduce the electrical conductivity of the electrode rod and decrease the power transmission efficiency, which may lead to a decrease in the reliability of the electrode part and a decrease in the life of the susceptor.

Due to the oxidation, a heat-resistant and oxidation-resistant material such as Ni or Ni alloy material has been used in the electrode rod of the related art. However, when the Ni-based heat-resistant material applied to the electrode rod of the related art is used as power transmission line in a high-frequency range, the impedance of the electrode rod increases due to the skin effect in which the current flows along the surface of the electrode rod, and heat generation occurs.

Furthermore, with advancements in semiconductor processing, susceptors are required to operate at higher temperatures and support high-power, high-frequency applications to achieve enhanced plasma characteristics. As a result, the skin effect in the electrode rod becomes more pronounced, leading to frequent short circuits due to heat generation and oxidation.

To address the problems above, as in Patent Publication No. KR 10-2018-0121662 (2018 Nov. 7), Au, Ag, Al, Cu, or the like is coated on a rod base material made of Ni or Ti, or as in Patent Publication No. 10-2021-0139368 (2021 Nov. 22), an alumina thin film was coated on a rod base material made of Mo, Ni, or Ti, in order to reduce heat generation or thermal conductivity. However, even in the cases above, the problem of increasing impedance of the electrode rod material due to frequency increase in power transmission in the high-frequency range has not been fundamentally solved.

FIG. 9 illustrates another electrode part of a ceramic susceptor of the related art.

Referring to FIG. 9, the ceramic susceptor of the related art has an electrode part at the center part of a ceramic plate 30 to enable connection with external electrode rods 31, 32. In the ceramic plate 30, an electrode 35, which may be a heating element (electrode) or an radio frequency (RF) electrode, is embedded in a ring shape, a circle, or the like, and a conductive pad 36, which is an electrode base material electrically connected to the electrode 35, is also embedded. An eyelet-shaped support 34 is screw-coupled through screw threads formed in an opening, and the upper electrode rod 31 is brazed to the lower electrode rod 32 and the lower electrode rod 32 is brazed to the conductive pad 36, thereby electrically connecting the electrode 35 to the electrode rods 31, 32 for supplying power. In the ceramic susceptor of the related art, as described above, a gap between the support 34 and the lower electrode rod 32 or a gap between the support 34 and the ceramic plate 30 produces a path through which oxygen may penetrate in a high-temperature atmosphere, thereby oxidizing the brazing filler 37 formed at the interface between the conductive pad 36, which is an electrode base material, and the lower electrode rod 32, or the conductive pad 36 and the lower electrode rod 32. The brazing filler formed at the interface between the upper electrode rod 31 and the lower electrode rod 32 may also be oxidized by the oxygen penetration. The oxidation may decrease electrical conductivity and power transmission efficiency, lead to a decrease in the reliability of the electrode part, thereby reducing the lifespan of the ceramic susceptor.

To overcome the problems related to reliability, described above, heat-resistant and oxidation-resistant material such as Ni or Ni alloy material has been mainly used for the electrode rod of the related art. Since the Ni material applied to the electrode rod of the related art is a ferromagnetic material, when used as a high-frequency power transmission line, for example, used as an electrode, the skin depth within the line through which electrons move is small due to the skin effect, making electron movement difficult, thereby increasing impedance, generating heat, and causing a short circuit with the ceramic plate 30, etc.

In addition, to improve the electrode rod of the related art, a material with low magnetic permeability such as Mo is used or a coating film for preventing oxidation of a rod material is applied. However, the coating film may be destroyed (cracked) during semiconductor processing due to thermal stress at the interface between the electrode rod metal material such as Mo and the coating film or the brittle nature of the coating material itself. This crack causes oxygen to penetrate the electrode rod metal material, thereby promoting oxidation of the electrode rod metal material.

SUMMARY OF THE INVENTION

The authors of the present disclosure have noted that Ni or Ni alloy material has high relative magnetic permeability (<600) as a ferromagnetic material and causes, when used as a radio frequency (RF) rod, the skin depth within an electrode rod to be extremely reduced according to the skin effect as power and frequency increase, thus making electron movement difficult and ultimately leading to increased impedance. The increase in the impedance of the electrode rod not only causes a decrease in plasma efficiency because the electric energy that should be consumed for plasma discharge is converted into heat energy and consumed at the electrode rod end, but also the heat generated from the electrode rod forms a hot spot on the upper surface of the ceramic plate that supports the substrate, leading to uneven thickness and quality of a thin film deposited on the substrate, which may be a factor in reducing yield.

In addition, thermal shock caused by the local rapid increase in the temperature of the ceramic area in contact with the area where the electrode rod is coupled is a decisive factor in causing the arc to occur, destroying the susceptor and damaging the brazed part. Accordingly, the impedance problem of the electrode rod should be solved to increase the yield of semiconductor elements and improve the durability of the susceptor.

Accordingly, the present disclosure provides a susceptor having an electrode rod having low impedance and good high-frequency transmission characteristics with respect to RF current.

In addition, the present disclosure provides an electrode rod having a surface-coated structure suitable for the RF power transmission described above.

In addition, the present disclosure provides an electrode rod having a surface-coated structure having resistance to heat generation due to the skin effect.

In addition, the present disclosure provides an electrode rod having a surface-coated structure exhibiting good brazing characteristics.

In addition, the present disclosure provides a method of manufacturing the electrode rod described above.

In addition, the present disclosure provides a susceptor having the electrode rod for RF power transmission described above.

In addition, the present disclosure provides a susceptor having an integrated electrode rod while having a surface-coated structure.

The present disclosure addresses the problem that even when Mo, W, or an alloy thereof is selected as a material for an electrode rod and a high-resistivity material, such as TiN, TiAlClN, TiAlN, or AlCrN, is used as a coating film, a coating film cracks at a brazed part where a step or corner exists along the extension of the electrode rod, causing oxygen to penetrate an electrode rod metal material and oxidation progress in the electrode rod metal material, leading to the concentrated formation of oxides, as shown in FIG. 9.

The present disclosure provides a ceramic susceptor with a unique position or structure of a brazed part on the extension of an electrode rod so as to provide an electrode rod structure of a ceramic susceptor with improved durability to ensure excellent high-frequency transmission characteristics in an oxidation-resistant and corrosion-resistant environment.

The present disclosure provides a susceptor including a ceramic plate on which an electrode is arranged, wherein the susceptor includes an electrode rod having one end electrically connected to the electrode and the other end electrically connected to a power source to supply power to the electrode, wherein the electrode rod includes a base material made of Mo, W, or an alloy thereof, and a metal nitride film surrounding the surface of the base material. In addition, in the present disclosure, the one end of the electrode rod may include an exposed surface of the base material that is not covered by the metal nitride film.

In the present disclosure, the metal nitride film may include an AlCrN film. At this time, the Cr/(Al+Cr) molar ratio of the AlCrN film may be 0.1 to 0.9.

In addition, the metal nitride film may include at least one nitride film selected from the group consisting of AlCrSiN, AlCrSiWN, and AlTiCrN.

In the present disclosure, the ratio of the resistivity of the metal nitride film to the resistivity of the base material may be $10^2$ or more, $10^3$ or more, or $10^4$ or more.

In the present disclosure, a CrN sublayer may be further included between the base material and the metal nitride film.

In the present disclosure, the thickness of the metal nitride film may have a value of 1.0 to 10.0 μm.

The present disclosure provides a susceptor including a ceramic plate on which an electrode is arranged, wherein the susceptor includes an electrode rod assembly having one end electrically connected to the electrode and the other end electrically connected to a power source to supply power to the electrode, and wherein the electrode rod assembly includes a first rod and a second rod connected in series, and the first rod includes a base material made of Mo, W, or an alloy thereof and a metal nitride film surrounding the surface of the base material.

In the present disclosure, the first rod and the second rod may be bonded by a bonding material.

In addition, the bonded surface of the first rod and the second rod may be an exposed surface of the base material that is not covered by the metal nitride film.

In the present disclosure, the first rod may include a base material made of Kovar.

In addition, the present disclosure provides a susceptor including a ceramic plate on which an electrode is arranged, wherein the ceramic plate includes an electrode pad connected to the electrode, and an electrode rod having one end connected to the electrode pad to supply power to the electrode, and the electrode rod includes an extension part connected to the electrode pad and a power connection part provided at an end of a tapered portion of the extension part.

The electrode rod may include a metal nitride film on the surface of the base material. The tapered portion may be tapered by a machine tool such that the tapered portion is included between the extension part and the power connection part having different diameters.

The tapered portion of the extension part may have an inclination angle of 10° to 80° with respect to the longitudinal direction of the extension part.

The tapered portion of the extension part may have a length of 1.0 mm to 10.0 mm in the longitudinal direction of the extension part.

The smaller-diameter end of the tapered portion of the extension part is positioned such that the temperature thereof is at least 10% lower than that of the lowermost surface of the ceramic plate.

The smaller-diameter end of the tapered portion of the extension part is positioned such that the temperature thereof is at least 20% lower than that of the lowermost surface of the ceramic plate.

The electrode rod may include a base material made of Mo, W, or an alloy thereof.

The extension part of the electrode rod may include a second rod brazed to the electrode pad and a first rod brazed to the second rod.

The second rod may be formed of a metal material having a thermal expansion coefficient difference of 3 or less with respect to the material of the electrode pad.

The electrode may be a high-frequency electrode, an electrostatic chuck electrode, or a heating element.

The first aspect of the present disclosure may provide a susceptor including an electrode rod having low impedance and good high-frequency transmission characteristics with respect to RF current.

In addition, according to the second aspect of the present disclosure, the electrode rod has a resistive surface coating, and thus, RF current flows through the base material within the surface coating during the RF power transmission through the electrode rod. As a result, a heat-generating part penetrates the inner side of the surface coating of the electrode rod. Accordingly, the heat-generating part moves away from the surface of the electrode rod, reducing the possibility of reacting with oxygen in the atmosphere.

In addition, the third aspect of the present disclosure may provide an electrode rod having a surface-coated structure suitable for RF power transmission.

In addition, the fourth aspect of the present disclosure may provide an electrode rod having a surface-coated structure having resistance to heat generation due to the skin effect.

In addition, the fifth aspect of the present disclosure may provide an electrode rod having a surface-coated structure exhibiting good brazing characteristics.

In addition, the sixth aspect of the present disclosure may provide a susceptor having an electrode rod for RF power transmission, which has the characteristics described above.

In addition, the seventh aspect of the present disclosure may provide a susceptor having an integrated electrode rod while having a surface-coated structure.

In addition, the eighth aspect of the present disclosure may provide a ceramic susceptor designed to have a streamlined shape, such as that of a trapezoid, to prevent the brazed part from forming sharp edges by positioning a tapered portion (AA) in a location where the electrode rod is spaced apart from the ceramic plate to receive power, particularly in a location where the temperature is significantly reduced during semiconductor processing, thereby improving durability and ensuring a long lifespan so as to have good high-frequency transmission characteristics for a long time even in an oxidation-resistant and corrosion-resistant environment.

BRIEF DESCRIPTION OF THE DRAWINGS

The accompanying drawings, which are included as part of the detailed description to help understanding of the present disclosure, provide examples of the present disclosure and explain the technical idea of the present disclosure together with the detailed description.

FIG. 1 illustrates an electrode part of a susceptor of the related art.

DETAILED DESCRIPTION OF THE EXEMPLARY EMBODIMENTS

Figure 2A:
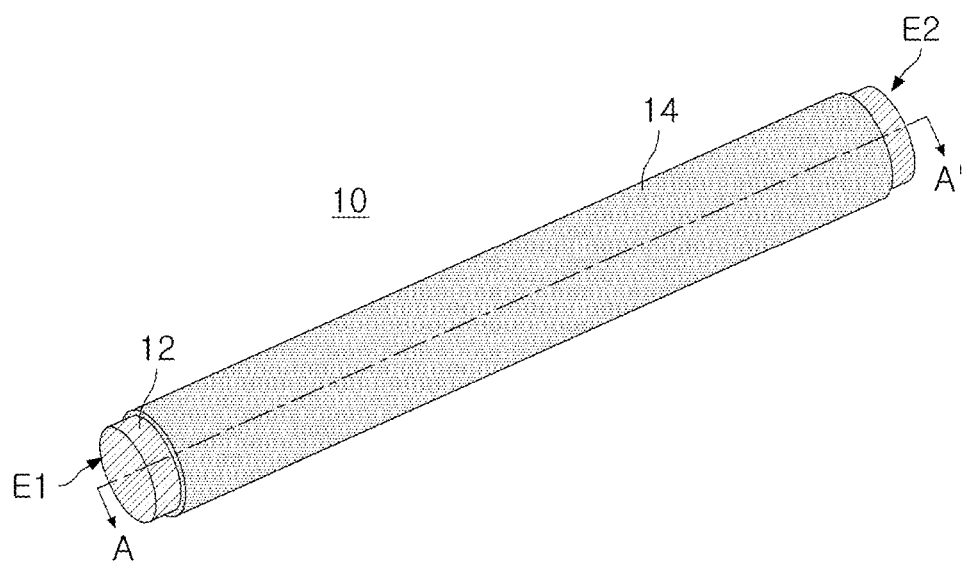
FIGS. 2A and 2B are respectively a perspective view and a cross-sectional view schematically illustrating the external appearance of an electrode rod according to an embodiment of the present disclosure.

Hereinafter, the present disclosure will be described in detail with reference to the attached drawings. At this time, in each drawing, the same components are represented by the same reference numerals as much as possible. In addition, detailed descriptions of functions and/or configurations that are already known will be omitted. The contents disclosed below will focus on parts necessary for understanding operations according to various embodiments, and descriptions of elements that may obscure the gist of the description will be omitted. In addition, some components of the drawings may be exaggerated, omitted, or schematically illustrated. The size of each component does not entirely reflect the actual size, and therefore, the contents described herein are not limited by the relative sizes or spacings of the components provided in each drawing.

In describing embodiments of the present disclosure, if it is determined that a detailed description of a known technology related to the present disclosure may unnecessarily obscure the gist of the present disclosure, the detailed description will be omitted. In addition, the terms described below are terms defined in consideration of their functions in the present disclosure and thus may vary depending on the intention or custom of a user or operator. Therefore, the definitions should be made based on the contents throughout this specification. The terms used in the detailed description are only for describing embodiments of the present disclosure, and should never be limited. Unless clearly used otherwise, the singular form includes the plural form. In this description, expressions such as "comprises" or "includes" are intended to indicate certain features, numbers, steps, operations, elements, parts or combinations thereof, and should not be construed to exclude the presence or possibility of one or more other features, numbers, steps, operations, elements, parts or combinations thereof other than those described.

In addition, although the terms, such as first, second, may be used to describe various components, the components are not limited by the terms, and the terms are used only for the purpose of distinguishing one component from another.

In addition, in the specification of the present disclosure, the nitride film in the "nitride film" or "metal nitride film" may be a nitride film of one metal element or a nitride film of two or more metal elements. In addition, in the specification of the present disclosure, the nitride film of the metal element A may be expressed as nitride film A or AN. At this time, the expressions "nitride film A" or "AN" may be used to refer to a nitride film of a binary metal element in which a part of the metal element A is replaced or substituted with another metal element, or a nitride film of a multicomponent metal element including another metal element. Similarly, the nitride film of the binary metal element may be expressed as "a nitride film of A and B", (A, B)N or ABN, and this expression may be used to refer to a nitride film of a ternary metal element including an additional metal element in addition to A or B, or a multicomponent metal nitride film of a ternary or more element system. For example, in the specification of the present disclosure, AlCrN may be used to mean not only a binary nitride film but also a ternary metal nitride film such as AlCrTiN.

In the specification of the present disclosure, the "electrical connection" of two components includes the two components being electrically connected by direct contact or being electrically connected by interposing one or more other components therebetween.

In addition, in the specification of the present disclosure, the terms "above" or "on" of an object are used to refer not only to a position that is in direct contact with the surface of the object, but also to a position that is not in direct contact by interposing another component.

Figure 2B:
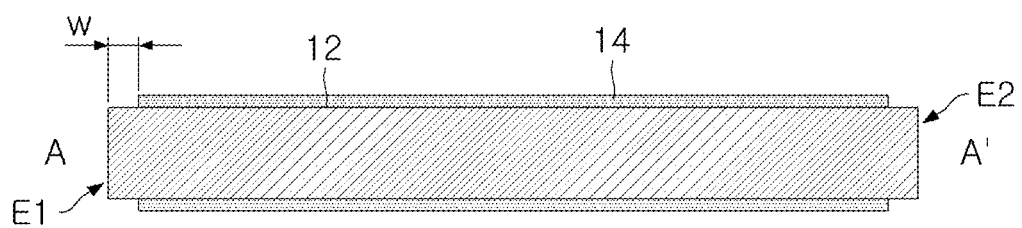

FIGS. 2A and 2B are respectively a perspective view and a cross-sectional view schematically illustrating the external appearance of an electrode rod according to an embodiment of the present disclosure.

Referring to FIGS. 2A and 2B, an electrode rod 10 has an elongated columnar shape extending in the longitudinal direction. The shape of the electrode rod in FIG. 1 is exemplary, and the present disclosure is not limited thereto, and in addition to a cylinder, an electrode rod of any shape such as a triangular column or a square column is also possible. In addition, although the end of the electrode rod is finished as a flat surface in the drawing, it is not limited thereto, and it is obvious that at least one of the ends of the electrode rod may have a curved shape.

The electrode rod 10 includes a base material 12 and a metal nitride film 14 on the surface of the base material 12. In the present disclosure, the metal nitride film 14 may be in direct contact with the base material, or an additional material layer may be interposed between the base material and the metal nitride film 14.

In the present disclosure, the base material 12 may have low impedance and may be made of a paramagnetic material. For example, the base material 12 may be made of Mo, W, or an alloy thereof, which is a paramagnetic material.

As illustrated, the metal nitride film 14 is formed on the surface of the base material 12. The metal nitride film 14 extends along the outer peripheral surface of the base material in the longitudinal direction.

Since the metal nitride film 14 of the electrode rod in the present disclosure has a higher impedance than the base material, a design for a connection part may be required for smooth connection of RF current between the electrode rod and other components. To this end, one end of the electrode rod 10 in the present disclosure may include an exposed surface (E1) that is not covered with the metal nitride film 14. In addition, the other end of the electrode rod 10 may include an exposed surface (E2) that is not covered with the metal nitride film 14.

In the present disclosure, the exposed surfaces (E1, E2) of the electrode rod 10 may provide better electrical connection with adjacent components. For example, as described below, the exposed surface (E1) may be in direct contact with a conductive pad of an electrode or may provide electrical connection to the conductive pad by interposing a conductive material layer such as a bonding material. In addition, the other exposed surface (E2) may provide electrical connection to an external power source.

In addition, in the present disclosure, the exposed surface (E1, E2) for electrical connection at one end of the electrode rod 10 may extend from the bottom surface to the side surface of the cylinder. At this time, the extension width (w) of the exposed surface may be appropriately designed. Of course, this exposed surface extension part may be provided at the other end of the electrode rod 10. Of course, the above-mentioned extension part of the exposed surface may also be implemented by chamfering the end of the electrode rod.

In the present disclosure, the metal nitride film may include a metal nitride film containing Cr. The metal nitride film may be a binary or ternary or higher metal nitride film containing Al and Cr. For example, the metal nitride film may include at least one nitride film selected from the group consisting of AlCrN, AlCrSiN, AlCrSiWN, AlTiCrN, and the like. In addition, the metal nitride film in the present disclosure may be a multilayer film in which layers of different compositions are laminated.

In the present disclosure, the metal nitride film has a higher resistance than the base material. The resistivities of Mo and W as the base material in the present disclosure are as shown in the table below.

TABLE 1

| Classification | Resistivity($\Omega \cdot$ cm, @20° C.) |
| --- | --- |
| Mo | $5.2*10^{-6}$ |
| W | $5.6*10^{-6}$ |

In the present disclosure, the resistivity (@20° C.) of the metal nitride film may be $1*10-4$ $\Omega \cdot$cm or less, $1*10-3$ $\Omega \cdot$cm or less, $1*10-2$ $\Omega \cdot$cm or less, $1*10-12$ cm or less, 12 cm or less, 1.5 $\Omega \cdot$cm or less, 2 $\Omega \cdot$cm or less, 5 $\Omega \cdot$cm or less, 10 $\Omega \cdot$cm or less, or 20 $\Omega \cdot$cm or less. On the other hand, the ratio of the resistivity of the metal nitride film to the resistivity of the base material may be $10^2$ or more, $10^3$ or more, $10^4$ or more, or $10^5$ or more.

In the specification of the present disclosure, the resistivity may be calculated by multiplying, by the thickness of the film, the surface resistance value obtained by multiplying, by the correction factor (C.F.), the resistance value of the film measured by the four point probe method.

In the present disclosure, the metal nitride film may further include one or more sublayers. For example, the sublayer may be a CrN sublayer.

In the present disclosure, when the metal nitride film is implemented using AlCrN, the resistivity value of the metal nitride film may be controlled by the relative contents of Al and Cr.

For example, the resistivity of the metal nitride film may be controlled by controlling the atomic ratio (x) of Cr in the composition of the metal nitride film expressed as $Al_{1-x}Cr_xN$ (where x is the atomic ratio), that is, Cr/(Al+Cr).

The CrN film formed by arc ion plating exhibits a resistivity of $3*10-4$ Ω·cm. The resistivity value may vary according to the contents of Al and Cr in $Al_{1-x}Cr_xN$ and the nitrogen concentration during the film formation process. An AlCrN film formed by arc ion plating with x≈0.2 to 0.8 may have a value of 1 to 15 Ω·cm, and an AlCrN film with x≈0.5 may have a value of about 7 to 9 Ω·cm. In the present disclosure, the resistivity may be controlled according to the ratio of Al and Cr.

In order to achieve a preferable resistivity value in the present disclosure, the x value of the $Al_{1-x}Cr_xN$ film may be 0.1 or more, 0.15 or more, 0.2 or more, or 0.25 or more. In addition, the x value may be 0.9 or less, 0.8 or less, 0.75 or less, 0.70 or less, 0.65 or less, 0.6 or less, 0.55 or less, or 0.5 or less.

In addition, the resistivity measurement values of various metal nitride films formed on $Al_2O_3$ substrates are summarized and shown in [Table 2] below.

TABLE 2

| Film composition | Resistivity(Ω · cm) |
|---|---|
| $Al_{0.45}Cr_{0.55}N$ | 7~9 |
| CrN | $3*10^{-4}$ |
| AlCrSiWN | $7*10^{-1}$ |
| AlCrSiN | $1.54*10^{-2}$ |

Figure 3:
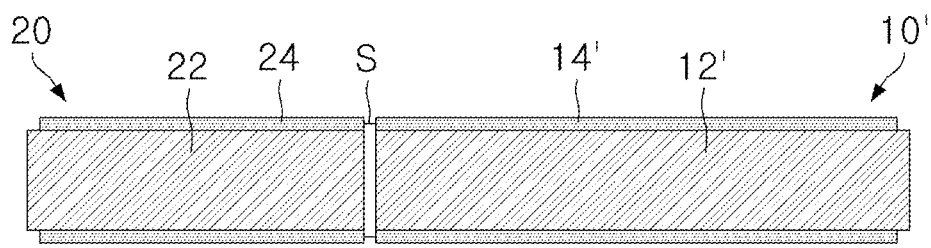
FIG. 3 schematically illustrates a cross-section of the structure of an electrode rod according to another embodiment of the present disclosure.

FIG. 3 schematically illustrates a cross-section of the structure of an electrode rod according to another embodiment of the present disclosure. Referring to FIG. 3, the electrode rod assembly 1 has a first rod 10'. The first rod 10' includes a base material 12' and a metal nitride film 14' surrounding the surface of the base material. In addition, a base material exposed surface on which the metal nitride film is not disposed are configured on both ends of the first rod 10'. The base material 12' and the metal nitride film 14' may be made of the same material as the electrode rod 10 described with reference to FIG. 2.

A second rod 20 is coupled to the front end of the first rod 10'. The first rod 10' and the second rod 20 may be coupled by a brazed part(S). The brazed part(S) may be provided by soldering or brazing an Au—Ni alloy bonding material or an alloy bonding material including Ti at an appropriate temperature.

In the present disclosure, the second rod 20 may include a second base material 22 and a second metal nitride film 24 surrounding the second base material. In addition, the second base material 22 may be exposed at both ends of the second rod 20.

In the present disclosure, the second base material 22 and the second metal nitride film 24 may be made of the same material as the first base material 12' and the first metal nitride film 14'.

In contrast, the second base material 22 may include a metal of a different material from the first base material 12'. In this case, a metal or alloy having a thermal expansion coefficient similar to that of the electrode pad may be used as the second base material 22. For example, when Mo, W, or an alloy thereof is used as the electrode pad, an alloy having a low thermal expansion coefficient such as Kovar may be used as the second base material 22. In this case, the second metal nitride film 24 in FIG. 3 may not be provided when a nickel-based alloy such as Kovar is used as the second base material 22.

In FIG. 3, the second rod 20 of the assembly 1 may be electrically connected to the electrode pad, and the first rod 10' of the assembly 1 may be electrically connected to an external power source. Of course, the reverse connection method is also possible.

Although the case in which two electrode rods are connected in series to configure an electrode rod assembly has been described with reference to FIG. 3 above, the present disclosure is not limited thereto, and for example, an electrode rod assembly configured by three or more electrode rods is also possible. Some or all of the electrode rods constituting these electrode rod assemblies may have the structure of the electrode rod described with respect to FIG. 2.

Figure 4:
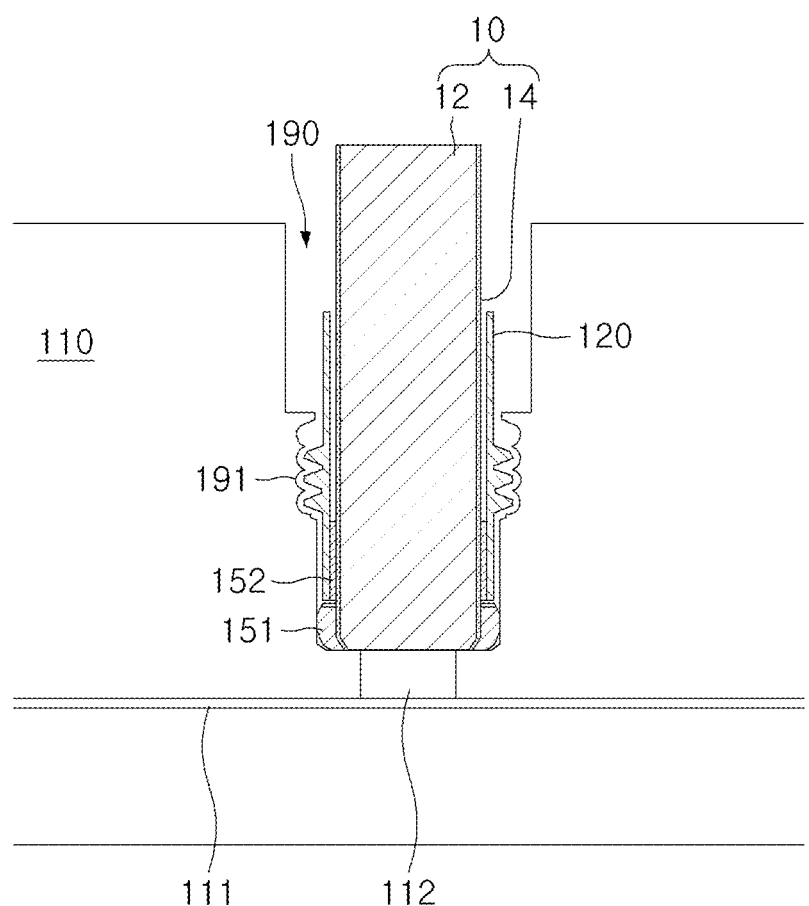
FIG. 4 is a cross-sectional view schematically illustrating a part of a susceptor according to an embodiment of the present disclosure.

FIG. 4 is a cross-sectional view schematically illustrating a part of a susceptor according to an embodiment of the present disclosure.

Referring to FIG. 4, a (ceramic) susceptor 100 includes a ceramic plate 110, an electrode 111 embedded in the ceramic plate 110, and an electrode pad 112 for electrical connection of the electrode. The ceramic plate 110 is provided with an opening 190 exposing the electrode pad, and an electrode rod 10 is coupled to the opening. The electrode rod 10 supplies power (e.g., radio frequency (RF) power) to the electrode 111.

In addition, a support eyelet 120 for supporting the electrode rod 10 may be provided within the opening along the outer periphery of the electrode rod 10. The support eyelet 120 may be screw-coupled to the opening. To this end, a screw thread 191 may be provided on a part of the inner peripheral surface of the opening 190, and correspondingly, a coupling structure (e.g., a male screw thread) for fastening with the screw thread 191 (e.g., a female screw thread) may be provided on the outer side of the support eyelet 120.

Although not shown in the drawing, in addition to the electrode 111, the ceramic plate 110 of the present disclosure may further include a heating element (not shown) for heating a substrate stably placed on the ceramic plate, and an electrode pad for supplying power to the heating element. Accordingly, although the structure of the electrode rod 10 of the electrode 111 is described in this specification, this structure may also be applied to the electrode rod for connecting the heating element (not shown) and the corresponding electrode rod.

In the present disclosure, the ceramic plate 110 may be configured such that the electrode 111 and/or heating element (not shown) are arranged (embedded) at a predetermined interval between ceramic materials. The ceramic plate 110 may be configured to stably support a substrate to be processed while enabling heating using a heating element (not shown) and/or a plasma-enhanced chemical vapor deposition process using the electrode 111. The ceramic plate 110 may be configured as a plate-shaped structure having a predetermined shape. For example, the ceramic plate 110 may be configured as a circular plate-shaped structure, but is not necessarily limited thereto. Here, the ceramic material may include at least one of $Al_2O_3$, $Y_2O_3$, $Al_2O_3/Y_2O_3$, $ZrO_2$, autoclaved lightweight concrete (AlC), TiN, AlN, TIC, MgO, CaO, $CeO_2$, $TiO_2$, $B_xC_y$, BN, $SiO_2$, SiC, YAG, Mullite, $AlF_3$, and may include aluminum nitride (AlN).

The electrode pad 112 electrically connected to the electrode 111 is exposed in the opening 190 of the ceramic plate 110. The electrode pad 112 and an end connection surface of the electrode rod 10 are electrically connected by a bonding process such as soldering or brazing.

In the present disclosure, the electrode 111 and the electrode pad 112, the support eyelet 120, and the heating element (not shown) may be made of a conductive material, such as tungsten (W), molybdenum (Mo), silver (Ag), copper (Cu), nickel (Ni), gold (Au), platinum (Pt), niobium (Nb), titanium (Ti), or an alloy thereof.

In the present disclosure, the electrode rod 10 has low resistance, i.e., low impedance, and is implemented as a paramagnetic material. Since the base material of the electrode rod is made of Mo, W, or an alloy thereof, which is a paramagnetic material, the electrode rod 10 has a large skin depth compared to Ni or a Ni alloy, and as a result, exhibits improved impedance characteristics.

Molybdenum, tungsten, and an alloy thereof, which are the base material of the electrode rod, exhibit characteristics that are easily oxidized by reacting with oxygen, compared to Ni or a Ni alloy. Therefore, as the base material heats up according to the application of RF current, the electrode rod is oxidized and deteriorated.

In order to solve the problem described above, the present disclosure provides a metal nitride film on the surface of the base material of the electrode rod 10. In addition, in the present disclosure, the metal nitride film is formed on the outer peripheral surface of the electrode rod, while the metal nitride film is not formed on the end of the electrode rod, which is connected to another component. Accordingly, the electrode rod may provide good electrical connection with an adjacent component while complementing the oxidation resistance of the base material.

In the present disclosure, the electrode rod has controlled electrical characteristics. In the present disclosure, the resistivity of the metal nitride film and the metal base material and the ratio thereof may be controlled to be within an appropriate range.

In the present disclosure, the metal nitride film may be appropriately designed according to the frequency and power of the RF current introduced into the electrode rod. When the RF power frequency increases, the skin depth of the base material decreases and the amount of heat generated on the surface of the base material may increase. In this case, the thickness of the metal nitride film may be increased.

For example, when the RF power frequency introduced into the electrode rod is 10 MHz, the skin depth of the Mo base material is about 38 μm, and when the RF power frequency is 100 MHz, the skin depth of the Mo base material is 12 μm.

In the present disclosure, the thickness of the metal nitride film may be in the range of 4 to 10 μm in an environment where an RF power frequency of 10 to 40 MHz is used (e.g., 13.56 MHz, 27.12 MHz, etc.).

In the present disclosure, one end of the electrode rod 10 may be bonded to the electrode pad 112 by soldering or brazing. To this end, a first conductive filler 151 may be provided at one end of the electrode rod 10 for bonding with the electrode pad 112.

In addition, a second conductive filler 152 may be provided around the electrode rod 10 inserted inside the support eyelet 120 to fill the space between the support eyelet 120 and the electrode rod 10. The first and second conductive fillers 151, 152 may be provided by soldering or brazing an Au—Ni alloy bonding material or an alloy bonding material including Ti at an appropriate temperature.

In the present disclosure, the amounts of the first and second conductive fillers may be appropriately controlled.

Figure 5:
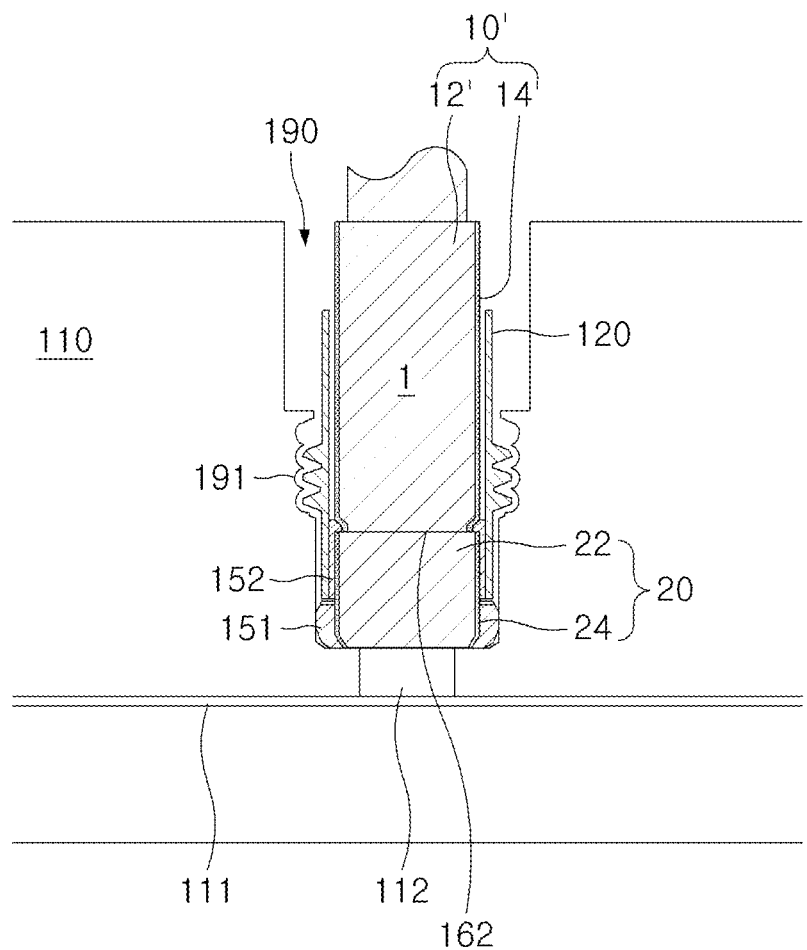
FIG. 5 is a cross-sectional view schematically illustrating the structure of a susceptor according to another embodiment of the present disclosure.

FIG. 5 is a cross-sectional view schematically illustrating the structure of a susceptor according to another embodiment of the present disclosure.

Referring to FIG. 5, the susceptor has substantially the same configuration except that the electrode rod 10 in FIG. 3 is replaced by the electrode rod assembly 1 described with reference to FIG. 2. The electrode rod assembly 1 is provided with the first rod 10' and the second rod 20 which are brazed 162 to each other, described with reference to FIG. 2, and the description thereof will be omitted since each configuration has been described in FIG. 2. As described above, the second rod 20 may not be provided with the metal nitride film 24.

Figure 6:
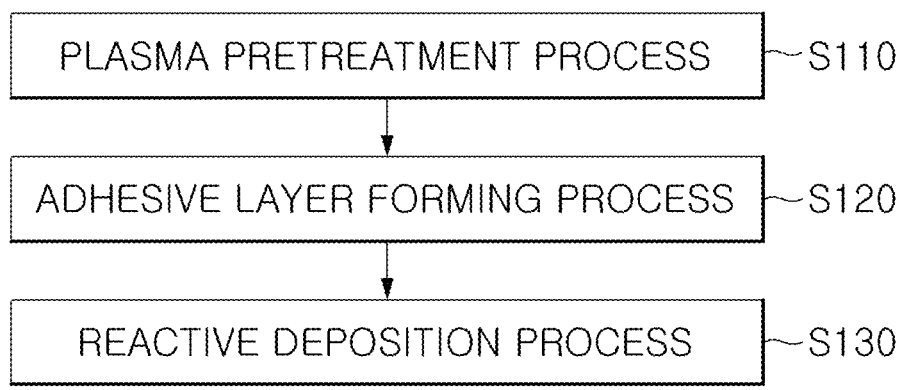
FIG. 6 is a procedure diagram of a metal nitride film forming process of an electrode rod of a susceptor according to an embodiment of the present disclosure.

FIG. 6 is a procedure diagram of a process for forming a metal nitride film of an electrode rod of a susceptor according to an embodiment of the present disclosure. In this embodiment, an AlCrN film is formed as a metal nitride film.

Referring to FIG. 6, various deposition techniques, for example, physical vapor deposition (PVD) techniques such as arc ion plating may be applied to the AlCrN forming process in the present disclosure.

As illustrated, the film of the electrode rod 10 may be formed by a plasma pretreatment process (S110), an adhesive layer forming process (S120), and a reactive deposition process (S130).

First, the surface of a base material made of Mo, W, or an alloy thereof is subjected to plasma pretreatment (S110). In the plasma pretreatment process (S110), an electrode rod base material 12 is charged into an arc ion plating device or sputtering device, and the surface of the electrode rod base material 12 is cleaned through plasma pretreatment at a vacuum level of $1\times10^{-5}$ Torr or less. This is to ensure that an adhesive layer and a metal nitride film are optimally coated in the subsequent process.

Next, the adhesive layer forming process (S120) is to reduce the internal stress of the metal nitride film to be formed and to ensure good adhesion. The adhesive layer may include a metal such as Cr or an alloy thereof. The adhesive layer may include Cr nitride or a nitride of a Cr alloy.

In the present disclosure, the adhesive layer may be formed by an arc ion plating or sputtering method. For example, a CrN layer may be deposited as an adhesive layer to have a thickness of 0.1 to 4.0 μm on the surface of each electrode rod base material 12 in an arc ion plating or sputtering device. At this time, a Cr target may be charged in advance into the arc ion plating or sputtering device, and nitrogen may be injected into a reactor, so that a CrN layer may be formed on the surface of the electrode rod base material 12 at a predetermined vacuum level by using the PVD method.

In the reactive deposition process (S130), Al and Cr targets or Al—Cr alloy targets are charged into the arc ion plating device, and AlCrN is formed to have a thickness of 1.0 to 10.0 μm at a vacuum level of about $1\times10^{-2}$ Torr by using the PVD method while nitrogen is injected into the reactor. The AlCr alloy target may be an AlCr alloy target containing aluminum (Al) and chromium (Cr) in a predetermined ratio (e.g., 7:3 at %). In contrast, when using the Al target and the Cr target, the Al/Cr ratio may be controlled by changing the current of each target.

As described above, the end of the base material may be appropriately masked such that a metal nitride film is not formed at the end of the electrode rod 10, 10'. For example, the end of the base material may be masked by providing an adhesive tape or a photoresist film at the end of the base material or by using a jig. In contrast, an exposed surface of the electrode rod may be, of course, implemented by processing the end of the electrode rod 10 on which the metal nitride film is formed, to expose the base material.

Experimental Example 1: Resistivity Measurement Experiment of AlCrN Film

By using alloy targets with different Al and Cr contents, AlCrN films were formed on the surface of an $Al_2O_3$ substrate by arc ion plating, the AlCrN film having an area of 30 mm×30 mm and a thickness of 5 to 7 μm. The Al and Cr ratios of the AlCrN films formed for each target were analyzed by EDS, and the resistivity of the AlCrN films was measured by the four-point probe method using a Loresta-GP device from Mitsubishi Chemical. The resistivity of the AlCrN films is 1 to 15 Ωcm.

The composition ratio (at %) of the EDS analysis results for each composition is as follows [Table 3].

TABLE 3

| Classification | Al:Cr (at %) |
|---|---|
| #1 | 82:18 |
| #2 | 67:33 |
| #3 | 45:55 |

Experimental Example 2: RF Power Loss Measurement Experiment of Electrode Rod

The RF power loss was measured by changing the material and film composition of the rod of Φ4×330 mm. The target rods for measurement were Ni rod, Mo rod, AlCrN/Mo rod, W rod, and AlCrN/W rod, and composition #2 of Experimental Example 1 was used for the composition of the AlCrN film.

Figure 7:
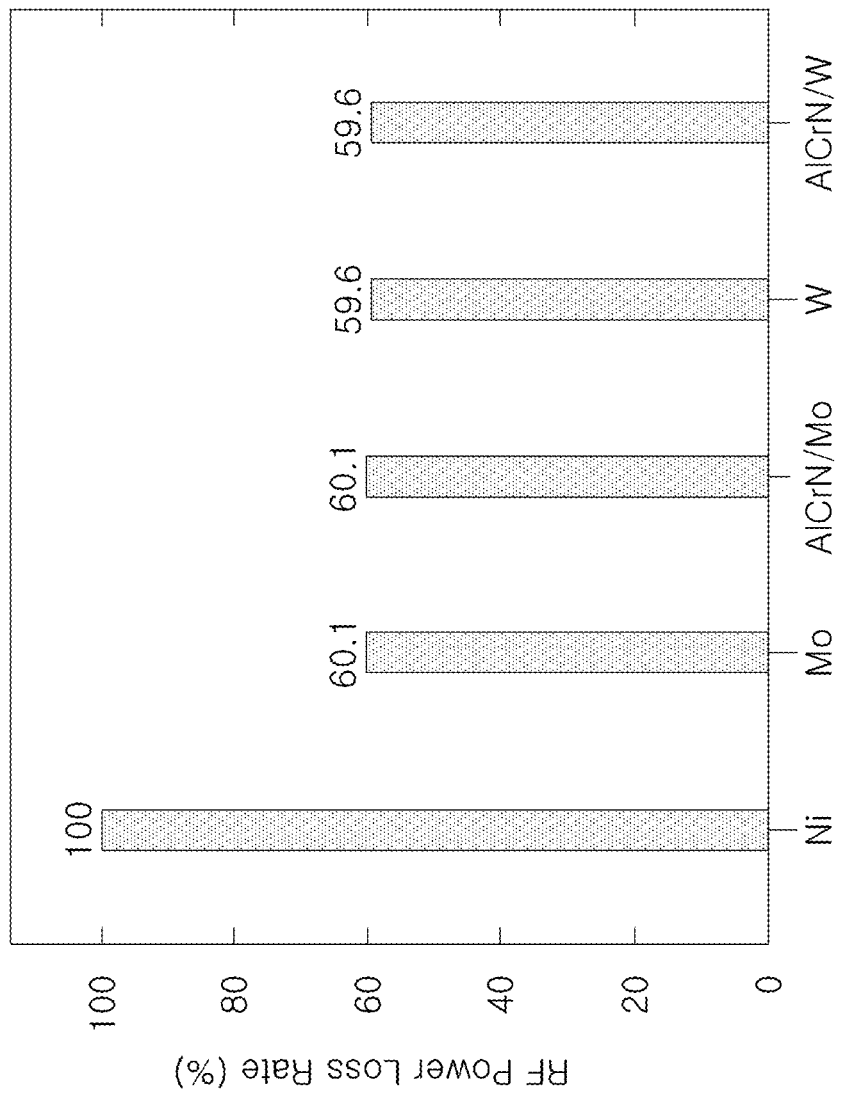
FIG. 7 illustrates the results of measuring power loss.

FIG. 7 illustrates the results of the power loss measurement. As noted from FIG. 7, when the radio frequency (RF) power loss rate calculated based on the impedance measurement value was compared with the loss rate of Ni, Mo or AlCrN/Mo having an AlCrN film on the surface thereof and W or AlCrN/W having an AlCrN film on the surface thereof had a loss rate reduced by about 40% compared to Ni. As noted from these results, the Mo, W, AlCrN/Mo, and AlCrN/W electrode rods show superior characteristics compared to Ni in terms of power loss.

Experimental Example 3: Oxidation Resistance Characteristics of Electrode Rod

The oxidation resistance characteristics of an electrode rod of Φ2×330 mm were identified according to the material and thin film composition.

Mo, MoW, AlCrN/Mo, and AlCrN/MoW rods were used as the electrode rod. Composition #2 of Experimental Example 1 was used for the AlCrN film.

Each rod was subjected to oxidation treatment at 700° C. for 10 hours in a box furnace. The resistance values of each rod before and after oxidation treatment were measured. Measurements were made under INT 10 mΩ conditions using a resistance meter (RM3545) measuring device from HIOKI.

Figure 8:
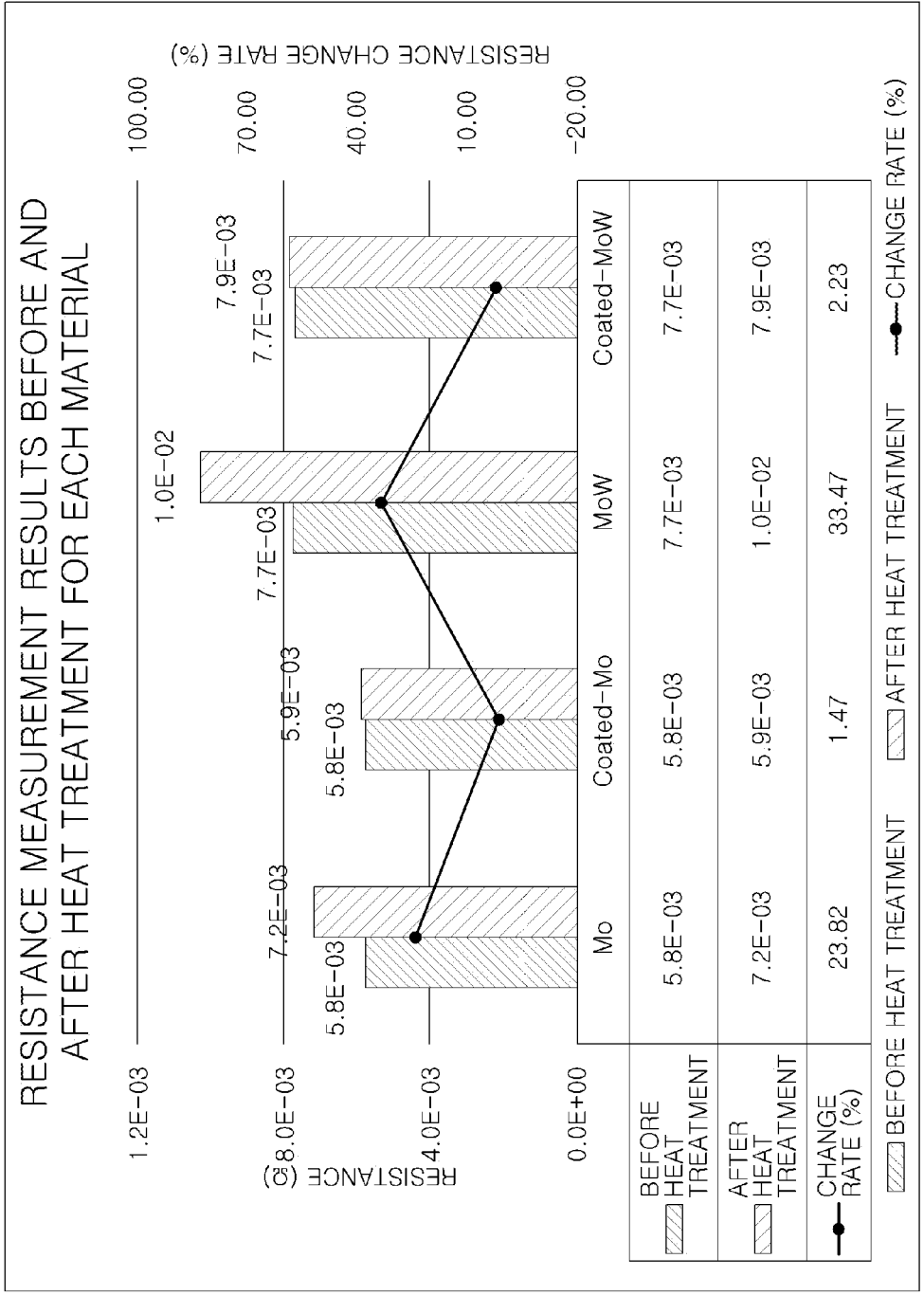
FIG. 8 is a graph plotting the results of measuring resistance values before and after oxidation treatment for each rod material.
Figure 9:
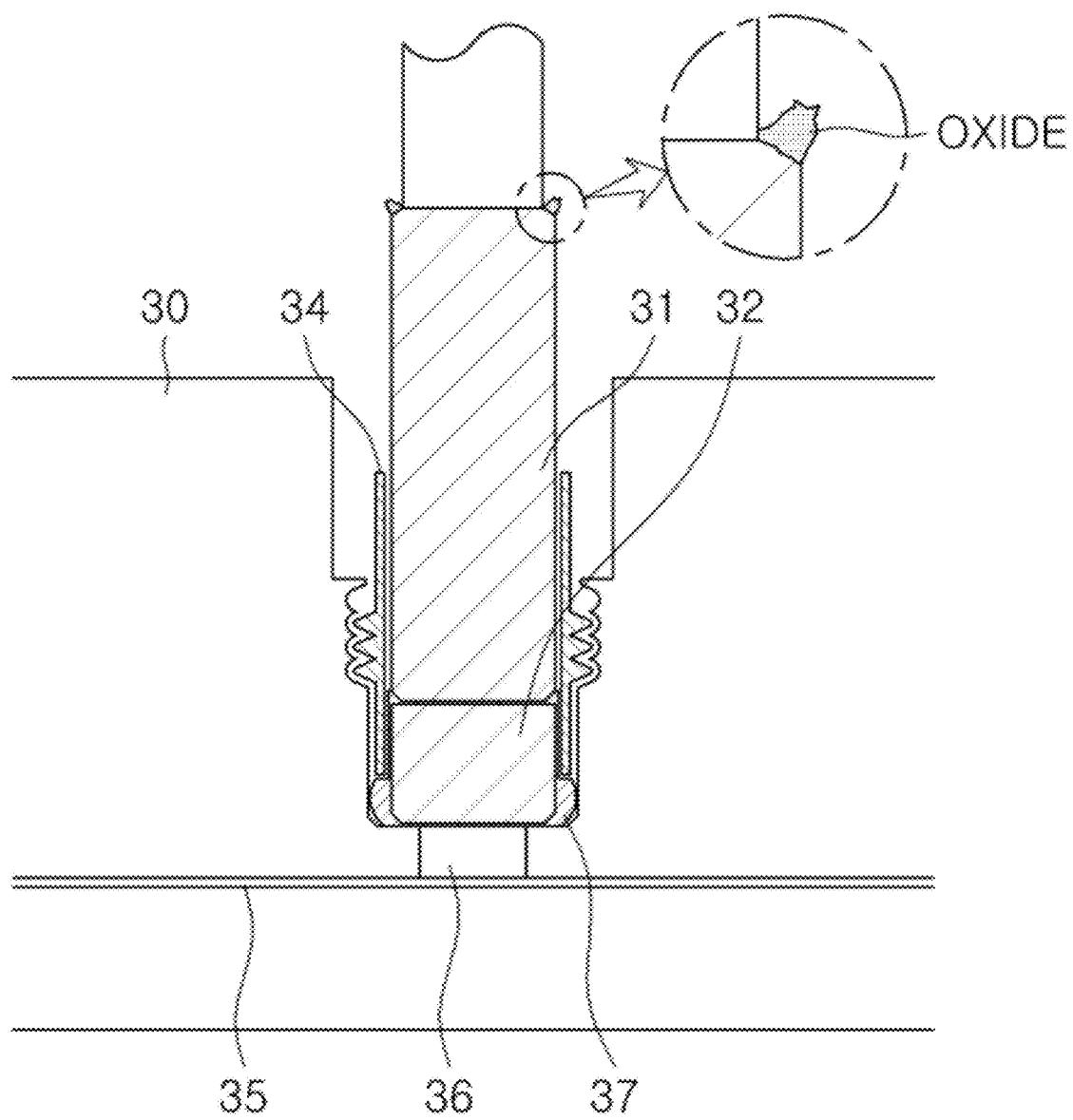
FIG. 9 illustrates another electrode part of a ceramic susceptor of the related art.

FIG. 8 is a graph plotting the results of resistance value measurements before and after oxidation treatment for each rod material.

As noted from FIG. 8, the resistance of each rod material increased due to oxidation treatment. However, in the case of a rod having a AlCrN film formed thereon, the resistance change rate before and after heat treatment was low, and the resistance value was also low.

In addition, a susceptor in the present disclosure is semiconductor equipment for processing a substrate to be processed, for various purposes, such as semiconductor wafers, glass substrates, flexible substrates, etc., and has an electrode 111 configured to function as a high-frequency electrode for processing the substrate to be processed, by dry etching using plasma or plasma-enhanced chemical vapor deposition, as described below. In addition, the electrode 111 may be used as a chuck electrode to be used as an electrostatic chuck to support the substrate to be processed. Furthermore, the susceptor in the present disclosure may further have a heating wire (or heating element/heating electrode) for heating the substrate to be processed, to a predetermined temperature.

The high-frequency electrode, electrostatic chuck electrode, heating wire, etc. as the electrode (or conductor) 111 may be made of a conductive metal material, such as silver (Ag), platinum (Pt), palladium (Pd), gold (Au), nickel (Ni), tungsten (W), molybdenum (Mo), and titanium (Ti), or an alloy thereof. The electrode as the high-frequency electrode may receive power during a semiconductor manufacturing process to enable a process, such as plasma-enhanced chemical vapor deposition, for a substrate positioned on the upper surface of a susceptor. In addition, the electrode as the electrostatic chuck electrode may generate an electrostatic force by receiving a bias from a power source during a semiconductor manufacturing process to chuck a substrate positioned on the upper surface of a susceptor. When unloading the substrate, the electrode may perform dechucking by discharging through the application of an opposite bias. In addition, the heating wire (or heating element/heating electrode) may be formed in a plate-shaped coil shape or a flat plate shape by a resistance wire having a predetermined resistance, and may also be formed in a multilayer structure for precise temperature control. The heating wire (or heating element/heating electrode) may perform a function of heating a substrate positioned on the upper surface of a susceptor to a constant temperature by receiving power to perform a smooth deposition process and etching process during the semiconductor manufacturing process.

Therefore, in the following, the present disclosure is described by an example in which the electrode 111 of the ceramic susceptor functions as the high-frequency electrode to which high-frequency (RF) power is supplied through the electrode rod, but it is not limited thereto, and it is to be noted in advance that the related description may be similarly applied even when the electrode of the ceramic susceptor in the present disclosure acts as a chuck electrode with an electrostatic chuck function or when power is supplied by an additional heating element through the electrode rod.

Hereinafter, other aspects of the present disclosure will be described with reference to the attached drawings, FIGS. 10A to 13. The same components in each drawing are represented by the same reference numerals. In addition, even if the numerals are not the same, if the names of the components are the same, the components may have the same structure and perform the same function. In particular, the same components described in the description of FIGS. 2A to 8 may be additionally applied to FIGS. 10A to 13, and detailed descriptions of the same functions and/or configurations described above will be omitted. In addition, the same components described in the description of FIGS. 10A to 13 may be additionally applied to FIGS. 2A to 8.

Figure 10A:
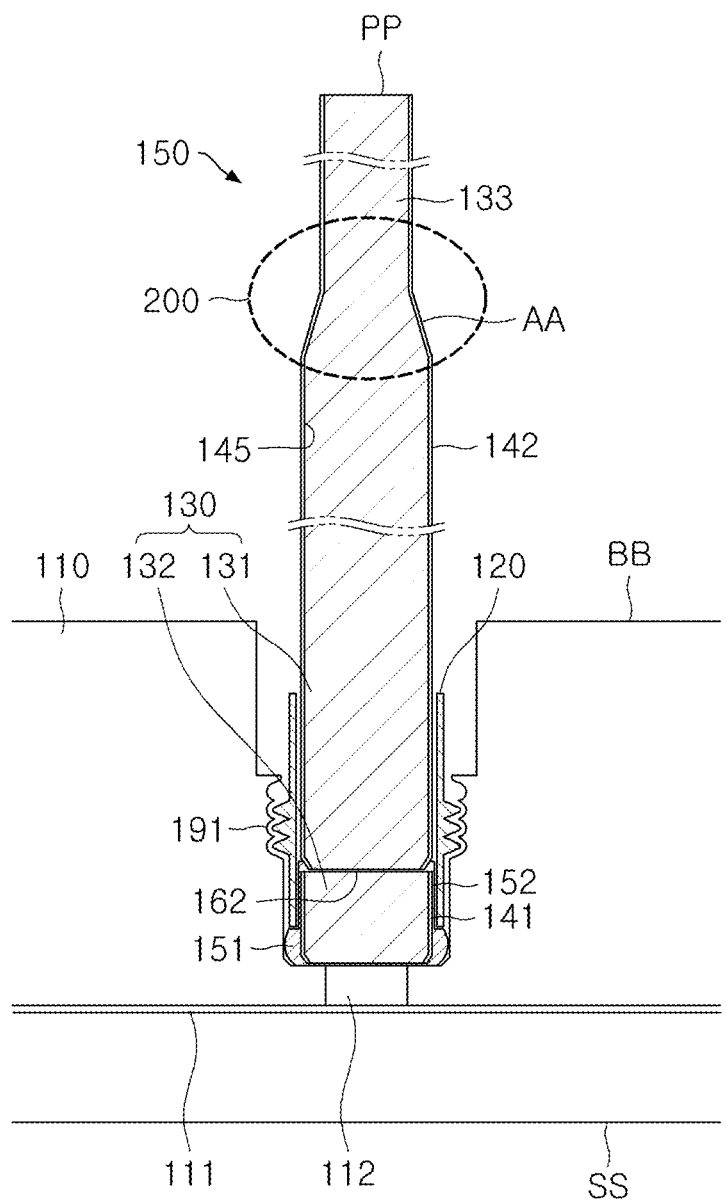
FIG. 10A illustrates the structure of a ceramic susceptor according to another embodiment of the present disclosure.

FIG. 10A illustrates the structure of a ceramic susceptor 100 according to another embodiment of the present disclosure.

Referring to FIG. 10A, the ceramic susceptor 100 according to another embodiment of the present disclosure may include a ceramic plate 110 on which an electrode 111 is arranged. Here, the ceramic plate 110 may include an electrode pad 112 connected to the electrode 111, and an electrode rod assembly 150 having one end connected to the electrode pad 112 to supply power to the electrode 112. In this case, the electrode rod assembly 150 includes an extension part 130 including a first rod 131 and a second rod 132.

That is, in FIG. 10A, the electrode rod assembly 150 may include the extension part 130 connected to the electrode pad 112 and a power connection part 133 provided at an end of a tapered portion (AA) of the extension part 130. That is, the electrode rod assembly 150 includes the extension part 130 including the first rod 131 and the second rod 132, and includes the tapered portion (AA) at an end of the extension part 130 and the power connection part 133.

In this case, the extension part 130 may include the first rod 131 and the second rod 132 brazed 162 to the first rod 131. The second rod 132 may be made of a metal material having a thermal expansion coefficient difference of 3 or less with respect to the material of the electrode pad 112. For example, the electrode pad 112, the first rod 131, and the power connection part 133 may have a thermal expansion coefficient of 4.5 to 5.6 μm/° C. and may be made of Mo, W, or an alloy thereof (MoW). The second rod 132 may have a thermal expansion coefficient of 4.9 to 6.2 μm/° C. and may be made of an Fe—Ni—Co alloy (e.g., Kovar product). The thermal expansion coefficient of the second rod 132 may differ, by 3 or less, from the thermal expansion coefficient of the first rod 131 including the power connection part 133.

Figure 10B:
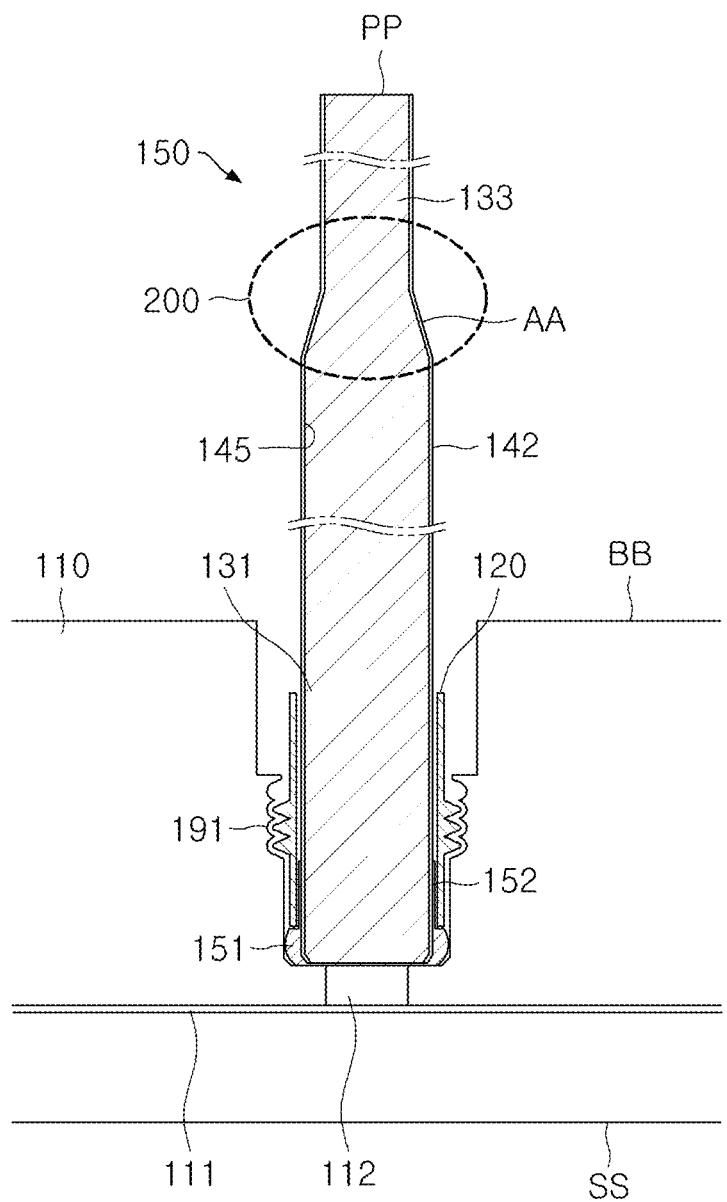
FIG. 10B illustrates the structure of a ceramic susceptor according to another embodiment of the present disclosure.

FIG. 10B illustrates the structure of the ceramic susceptor 200 according to another embodiment of the present disclosure. In this case, one rod is connected to the electrode pad 112 and extends to the power connection part 133.

Referring to FIG. 10B, the ceramic susceptor 200 according to another embodiment of the present disclosure may include the ceramic plate 110 on which the electrode 111 is arranged. Here, the ceramic plate 110 may include the electrode pad 112 connected to the electrode 111, and the electrode rod assembly 150 having one end connected to the electrode pad 112 to supply power to the electrode 112.

In this case, the electrode rod assembly 150 may include the first rod or the extension part 131 connected to the electrode pad 112, and the power connection part 133 provided at the end of a tapered portion (AA) of the extension part 131. That is, the electrode rod assembly 150 includes the extension part 131 formed as a single rod, and includes the tapered portion (AA) at the end of the extension part 131 and the power connection part 133. Here, for example, the extension part 131 including the power connection part 133 may have a thermal expansion coefficient of 4.5 to 5.6 μm/° C. and may be made of Mo, W, or an alloy material thereof.

That is, as shown in FIGS. 10A and 10B, the electrode rod assembly 150 of the present disclosure may include the extension part 130/131 connected to the electrode pad 112 and the power connection part 133 provided at the end of the tapered portion (AA) of the extension part 130/131.

In addition, the ceramic susceptor 100 may include a support eyelet 120 coupled with the electrode rod assembly 150. For example, the electrode rod assembly 150 may be coupled to the support eyelet 120 that is fastened to the electrode 111 through a screw thread 191 of the ceramic plate 110.

As described above, although not shown in the drawing, the ceramic plate 110 in the present disclosure may further include a heating element (electrode) (not shown) and the corresponding electrode rod. Therefore, although the structure related to the electrode rod assembly 150 of the electrode 111 is described in the present disclosure, this structure may be applied to the heating element (electrode) (not shown) and the corresponding electrode rod as well.

That is, the ceramic plate 110 may be configured such that the electrode 111 and/or the heating element (electrode) are arranged (embedded) between the ceramic materials at a predetermined interval. The ceramic plate 110 is configured to stably support the substrate to be processed, which is placed on the upper surface (SS), while enabling heating using the heating element (electrode) and/or an electrostatic chucking function using the electrode 111 or a semiconductor process using plasma. The ceramic plate 110 may be formed as a plate-shaped structure having a predetermined shape. For example, the ceramic plate 110 may be formed as a circular plate-shaped structure, but is not necessarily limited thereto. Here, the ceramic material may be at least one of $Al_2O_3$, $Y_2O_3$, $Al_2O_3/Y_2O_3$, $ZrO_2$, AIC (autoclaved lightweight concrete), TiN, AlN, TiC, MgO, CaO, $CeO_2$, $TiO_2$, $B_xC_y$, BN, $SiO_2$, SiC, YAG, Mullite, $AlF_3$, and may be aluminum nitride (AlN). Furthermore, each ceramic powder may optionally contain about 0.1 to 10%, and may contain about 1 to 5% of yttrium oxide or MgO, $TiO_2$ powder, etc.

The electrode pad 112 is embedded in the ceramic plate 110 so as to be partially exposed from the bottom surface of a predetermined aperture part of the ceramic plate 110. The end surface of the electrode rod assembly 150 and the electrode pad 112 may be electrically connected by brazing.

The electrode 111, the electrode pad 112, the electrode rod assembly 150, the support eyelet 120, etc. may be made of a conductor, and may be formed of, for example, tungsten (W), molybdenum (Mo), silver (Ag), platinum (Pt), palladium (Pd), nickel (Ni), gold (Au), niobium (Nb), titanium (Ti), or an alloy thereof.

Particularly, in the present disclosure, the electrode rod assembly 150 may have low impedance and may be made of a paramagnetic material. For example, the electrode rod assembly 150 may be formed of a base material made of Mo, W, or an alloy thereof, and an oxidation resistant film is provided on the surface of the base material of the electrode rod assembly 150. As described above, for example, in FIG. 10A, the first rod 131 including the electrode pad 112 and the power connection part 133 may be formed of Mo, W, or an alloy thereof, and the second rod 132 may be formed of an Fe—Ni—Co alloy (e.g., Kovar product). In addition, for example, in FIG. 10B, the extension part 131 including the power connection part 133 may have a thermal expansion coefficient of 4.5 to 5.6 μm/° C. and may be formed of Mo, W, or an alloy thereof.

In the present disclosure, the oxidation resistant film may include a metal nitride film 141, 142. For example, the metal nitride film may include AlN, and may include TiN, TiAl- CrN, TiAlN, and AlCrN. Accordingly, the present disclosure may provide the ceramic susceptor 100 that has all the thermal, electrical (magnetic), and mechanical properties required in the manufacturing and processing process environment of the ceramic susceptor 100 and is advantageous in terms of processability and material cost.

In the ceramic susceptor 100 having the structure of FIG. 10A according to the present disclosure, one side of the electrode rod assembly 150 may be coupled inside the support eyelet 120 and may include the first rod 131 and the second rod 132 connected by brazing. The extension part 130 may be configured as a single rod in which the first rod 131 and the second rod 132 are integrated with each other, but may also have a structure in which the first rod 131 and the second rod 132 are bonded to each other. One end surface of the second rod 132 may be brazed to the electrode pad 112 by the first conductive filler 151, and the first rod 131 may be brazed to the other end surface of the second rod 132 by the second conductive filler 162. For example, the conductive filler 151, 162 may include an Au—Ni metal filler, etc. The conductive filler 152 may be provided around the rod 131, 132 inserted inside the support eyelet 120 to fill the space between the support eyelet 120 and the rod 131, 132. The electrode pad 112 may be made of Mo, W, or an alloy thereof. The second rod 132 is close to the electrode 111 and causes heat loss and thermal stress. Thus, as described above, the second rod 132 may be made of a metal material having a thermal expansion coefficient difference of 3 or less with respect to the material of the electrode pad 112 in order to prevent heat loss and reduce crack occurrence due to thermal stress. Particularly, in the present disclosure, in order to prevent oxidation (corrosion), the metal nitride film 141, 142 may be included on the surface of the electrode rod assembly 150, that is, the metal nitride film 141 may be included on the surface of the second rod 132 and the metal nitride film 142 may be included on the surface of the first rod 131. According to cases, the metal nitride film 141 may not be necessary on the surface of the second rod 132. However, the metal nitride film 141 may be formed on the surface of the second rod 132 as needed.

In addition, the electrode rod assembly 150 includes the power connection part 133 having a different diameter from the extension part 131, 132, 130 and extending from the end of the extension part 130 to be tapered.

For each brazing process as described above, first, the first conductive filler 151 is injected in advance into the bottom surface of the opening 190, i.e., around the exposed part of the electrode pad 112, and the second rod 132 is pushed inside the support eyelet 120 to bring the electrode pad 112 into tight contact with one end surface of the second rod 132. Next, the second conductive filler 162 is sufficiently injected onto the upper part of the other end surface of the second rod 132, and then heated at a high temperature and cooled after the one end surface of the first rod 131 is brought into tight contact with the injected second conductive filler 162.

Similarly, the method described above is applied to the ceramic susceptor 200 having the structure of FIG. 10B according to the present disclosure, except that the second rod 132 is omitted therefrom. Accordingly, one end surface of the extension part 131 or the first rod configured by one first rod 131 may be brazed to the electrode pad 112 by the first conductive filler 151. The conductive filler 152 may be provided around the rod 131 inserted inside the support eyelet 120 to fill the space between the support eyelet 120 and the rod 131.

By using the ceramic susceptor 100/200 of the present disclosure, the power connection part 133 of the electrode rod assembly 150 may be connected to the power source and power may be supplied to the electrode 111 through the electrode pad 112, thereby performing a semiconductor process, such as plasma-enhanced chemical vapor deposition or dry etching using plasma, or the function of an electrostatic chuck, and heating a substrate to be processed (e.g., a semiconductor wafer, a glass substrate, a flexible substrate, etc.) in a semiconductor process and the like by using heat (or high frequency) generated from a heating element (electrode).

In particular, the electrode rod assembly 150 may be made of an alloy (e.g., MoW, MoNi, WNi, etc.) containing Mo, W, or one or more thereof in a greater weight ratio (wt %) than other metal materials, and the electrode rod assembly 150 may include a metal nitride film 141, 142 on the surface thereof for oxidation (corrosion) resistance, thereby effectively preventing oxidation of the electrode rod assembly 150 and eliminating the factor contributing to impedance increase during use. Energy loss converted into heat energy in the electrode rod assembly 150 may be eliminated by reducing changes such as an increase in impedance of the electrode rod assembly 150, thereby allowing electric energy to be efficiently consumed for plasma discharge. In addition, a hot-spot zone may not be formed on the upper surface of the ceramic plate 110 supporting the substrate by reducing the heat generated from the electrode rod assembly 150, thereby improving the uniformity of thin film quality and the thickness of the thin film deposited on the substrate and increasing the yield. In addition, the temperature increase in the ceramic area that comes into contact with the part where the electrode rod assembly 150 is fastened may be eliminated to reduce the risk of thermal shock-induced fracture of the ceramic susceptor 100, thereby reducing arc occurrence at the brazed part. Therefore, the reduction in the impedance change of the electrode rod assembly 150 in the present disclosure may provide the ceramic susceptor 100 having improved durability and may contribute to the increase in the yield of a semiconductor element.

Figure 11:
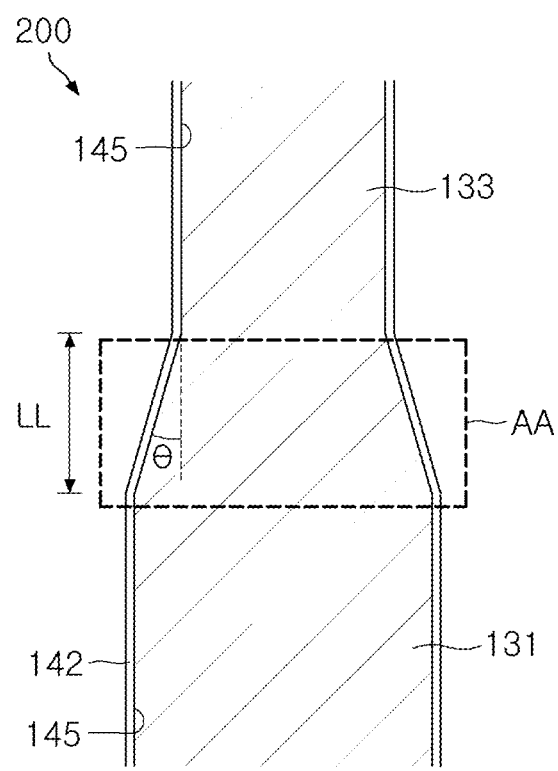
FIG. 11 is an enlarged view of a peripheral part including a tapered portion (AA) between the extension part and the power connection part in FIGS. 10A and 10B according to the present disclosure.

FIG. 11 is an enlarged view of a peripheral part 200 including a tapered portion (AA) between the extension part 130/131 and the power connection part 133 in FIGS. 10A and 10B according to the present disclosure.

Referring to FIG. 11, as described above, the power connection part 133 is provided at the end of a tapered portion (AA) of the extension part 130/131 of the electrode rod assembly 150. That is, the tapered portion (AA) may be formed through taper machining using a machine tool such that the tapered portion (AA) is included between the extension part 130/131 and the power connection part 133 which have different diameters from each other. The machine tool may include a processing device that utilizes various methods, such as a milling machine, a lathe, a machining center (MCT), a computer numerical control (CNC), and a laser.

In the present disclosure, the tapered portion (AA) of the electrode rod assembly 150 may be formed by processing the corresponding cylindrical rod 130/131 along the circumference thereof at a constant inclination angle ($\theta$). The overall length of the electrode rod assembly 150 may be, for example, 250 to 400 mm, and among the overall length, the length (LL) of the tapered portion (AA) gradually becoming thinner from the extension part 130/131 toward the power connection part 133 may be 1.0 to 10.0 mm in the longitudinal direction of the extension part 130/131.

In addition, the inclination angle ($\theta$) of the tapered portion (AA) of the extension part 130/131 may be 10° to 80° with respect to the longitudinal direction of the extension part 130, and may be 45° or less, 40° or less, 35° or less, 30° or less, 25° or less, or 20° or less for a smoother streamlined connection. The inclination angle (θ) may be 12° to 16°. Accordingly, the longitudinal cross section of the tapered portion (AA) of the extension part 130/131 may have a trapezoidal shape.

In addition, the end having a smaller diameter in the tapered portion (AA) of the extension part 130/131 may be determined to have a predetermined position for improving oxidation resistance and corrosion resistance. The end having a smaller diameter in the tapered portion (AA) of the extension part 130/131 may be positioned such that the temperature thereof is, for example, at least 10% lower, and preferably at least 20% lower than the temperature of the ceramic plate 110, i.e., the temperature (e.g., 650° C., 550° C., 450° C., etc.) of the lowermost surface (see BB in FIG. 12) of the ceramic plate 110 when the ceramic plate 110 is operated, i.e., the heating element (electrode) is operated (or, an external heater may be used when the heating element is absent).

mount 320. That is, the power connection part 133 of the electrode rod(s) 130/132 may extend outside the chamber 300 such that the end (PP) of the power connection part 133 is connected to a connecting means of a power source to receive necessary power.

The heating element of the ceramic plate 110 was operated in the chamber 300 described above such that the temperature of the ceramic plate 110 was set to 650° C., 550° C., and 450° C. While moving downward at a predetermined interval, starting from an external position (A) on the shaft 310 parallel to the lowermost surface (BB), the temperature was measured at positions A, B, C, D, E, and F. The results shown in Table 4 below identifies a progressive decrease in temperature. In the susceptor sample used here, the electrode rod assembly 150 had a total length of about 330 mm, the diameter of the extension part 131, 132 was 4.6 mm, and the diameter of the power connection part 133 was 4 mm. In addition, the length (LL) of the tapered portion (AA) was 2.5 mm, and the inclination angle (θ) of the tapered portion (AA) was 13.7°.

TABLE 4

| Position | Temperature (°C) | Temperature difference by position (%) | Temperature (°C) | Temperature difference by position (%) | Temperature (°C) | Temperature difference by position (%) |
| --- | --- | --- | --- | --- | --- | --- |
| A | 650.0 | 0.0 | 550.0 | 0.0 | 450.0 | 0.0 |
| B | 609.7 | 6.2 | 516.86 | 6.0 | 420.98 | 6.4 |
| C | 529.0 | 18.6 | 445.4 | 19.0 | 364.63 | 19.0 |
| D | 468.0 | 28.0 | 390.26 | 29.0 | 322.4 | 28.4 |
| E | 404.5 | 37.8 | 335.92 | 38.9 | 281.77 | 37.4 |
| F | 327.9 | 49.6 | 284.93 | 48.2 | 242.97 | 46.0 |

In the following example as described below, the entire length of the electrode rod assembly 150 was about 330 mm, the diameter of the extension part 131, 132 was 4.6 mm, the diameter of the power connection part 133 was 4 mm, the length (LL) of the tapered portion (AA) was 2.5 mm, and the inclination angle (θ) of the tapered portion (AA) was 13.7°. As noted from the above, the position where the temperature is 80% or lower compared to the temperature (e.g., 650° C., 550° C., 450° C., etc.) of the lowermost surface (see BB in FIG. 12) of the ceramic plate 110 is spaced apart by 5 mm or more from the lowermost surface (see BB in FIG. 12) of the ceramic plate 110.

That is, the tapered portion (AA) was placed at a position where the temperature is greatly lowered during the semiconductor process, among the positions spaced apart from the ceramic plate 110, so as to prevent oxidation or corrosion due to high temperature that may occur during the brazing or deposition process at the corresponding part.

Figure 12:
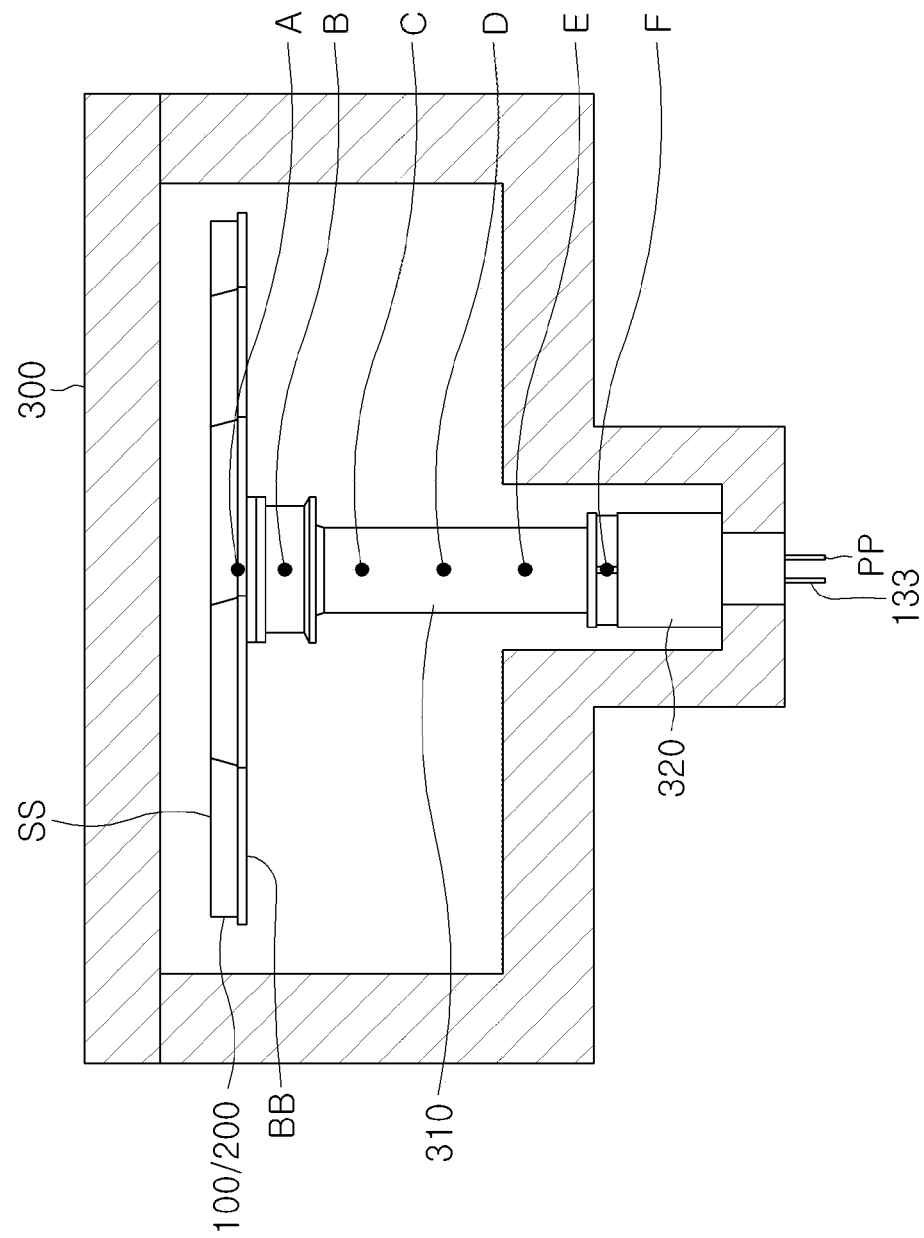
FIG. 12 shows an example in which a ceramic susceptor of the present disclosure is installed in a process chamber of semiconductor equipment.

FIG. 12 shows an example in which a ceramic susceptor 100 of the present disclosure is installed in a process chamber 300 of semiconductor equipment.

Referring to FIG. 12, the ceramic susceptor 100/200 may be installed inside the process chamber 300 of the semiconductor equipment for performing a semiconductor process such as plasma-enhanced chemical vapor deposition, and the ceramic susceptor 100/200 may be installed so as to be supported by a predetermined connection mount 320 and a shaft 310 having a through-hole therein.

The electrode rod(s) 130/132 connected to the electrode pad(s) 112 of the ceramic plate 110 in the ceramic susceptor 100/200 may extend outside the chamber 300 by penetrating the inside of the shaft 310 and penetrating the connection As shown in the table above, in case that the temperatures at position (A) of the lowermost surface (BB) of the ceramic plate 110 are 650° C., 550° C., and 450° C., the position at least 10% lower than the temperatures is identified as position C, and the position at least 20% lower than the temperatures is identified as position D. Therefore, in the case above, the smaller end in the tapered portion (AA) of the extension part 130/131 may be at position C, D, E, or F, and may be at position D, E, or F.

Accordingly, the tapered portion (AA) may be positioned such that a temperature thereof is at least 10% lower than that of the ceramic plate 110, thereby improving the oxidation resistance and corrosion resistance of the electrode rod assembly 150.

As described above, the ceramic susceptor 100 according to the present disclosure is designed to be in a streamlined form, such as a trapezoid, to prevent the tapered portion (AA) from forming sharp edges by positioning the tapered portion (AA) in a location where the electrode rod assembly 150 is spaced apart from the ceramic plate 110 to receive power, particularly in a location where the temperature is significantly reduced during semiconductor processing, thereby improving durability and ensuring a long lifespan so as to have good high-frequency transmission characteristics for a long time even in an oxidation-resistant and corrosion-resistant environment.

Figure 13:
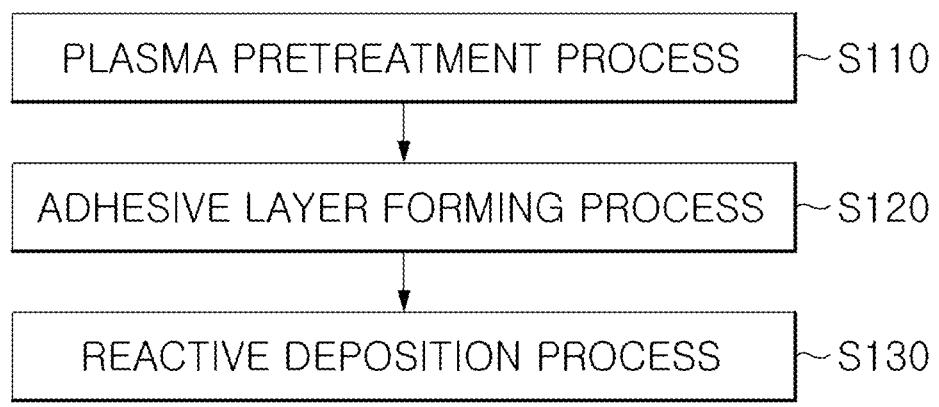
FIG. 13 is a flowchart for explaining a process for forming a thin film of an electrode rod of a ceramic susceptor according to an embodiment of the present disclosure.

FIG. 13 is a flowchart for explaining a process for forming a thin film of the electrode rod assembly 150 of the ceramic susceptor 100 according to an embodiment of the present disclosure.

Referring to FIG. 13, first, in order to form a thin film on the electrode rod assembly 150, a physical vapor deposition (PVD) technique such as arc ion plating may be applied to form a metal nitride film 141, 142 on the surface of the base material of the electrode rod assembly 150, made of Mo, W, or an alloy thereof. As illustrated, the thin film of the electrode rod assembly 150 may be formed by a process including a plasma pretreatment process (S110), a process for forming an adhesive layer 145 (S120), and a reactive deposition process (S130). First, in the plasma pretreatment process (S110), before the adhesive layer 145 is formed in the arc ion plating device or sputtering device, the base material of the electrode rod assembly 150 is loaded and the surface of the base material of the electrode rod assembly 150 is cleaned through plasma pretreatment at a vacuum of 1×10−5 Torr or less. This is to ensure that the adhesive layer 145 and the metal nitride film 141, 142 are optimally coated in the subsequent process. Here, the electrode rod assembly 150 may be a rod in which the extension part 130/131, the tapered portion (AA), and the power connection part 133 are formed in advance.

Next, the process for forming an adhesive layer (S120) is for reducing the internal stress of the metal nitride film 141, 142 and for good adhesion. The adhesive layer 145 may include a metal such as Cr or an alloy thereof. The adhesive layer may include Cr nitride or a nitride of a Cr alloy.

In the present disclosure, the adhesive layer 145 may be formed by an arc ion plating or sputtering method. For example, a CrN layer may be deposited as an adhesive layer 145 having a thickness of 0.1 to 4.0 μm on the surface of the base material of the extension part 130/131 of each electrode rod assembly 150 in an arc ion plating or sputtering device. At this time, a Cr target may be charged in advance into the arc ion plating or sputtering device, and nitrogen may be injected into a reactor, so that the CrN layer may be formed at a predetermined vacuum level on the surface of the base material of the extension part 130/131 of the electrode rod assembly 150, that is, on the extension part 130/131 including the power connection part 133 and the tapered portion (AA) of the electrode rod assembly 150, by using a PVD method.

In the reactive deposition process (S130), an Al target and a Cr target are charged or an AlCr alloy target, etc. is charged in advance into an arc ion plating device or a sputtering device, and nitrogen is injected into the reactor of the arc ion plating device or the sputtering device, and a metal nitride film 141, 142 is formed to have a thickness of 1.0 to 10.0 μm at a vacuum level of about $1\times10^{-2}$ Torr by using the PVD method. The AlCr alloy target may be an AlCr alloy target in which aluminum (Al) and chromium (Cr) are alloyed at a predetermined ratio (e.g., 7:3 at %). In contrast, when an Al target and a Cr target are charged to be used, the ratio of Al and Cr required for the formation of the metal nitride film 141, 142 may be controlled by changing the current for each target.

As described above, the ceramic susceptor 100/200 according to the present disclosure is designed to be in a streamlined form, such as a trapezoid, to prevent formation of sharp edges by positioning the tapered portion (AA) in a location where the electrode rod assembly 150 is spaced apart from the ceramic plate 110 to receive power, particularly in a location where the temperature is significantly reduced during semiconductor processing, thereby improving durability and ensuring a long lifespan so as to have good high-frequency transmission characteristics for a long time even in an oxidation-resistant and corrosion-resistant environment.

Although the present disclosure has been described with reference to specific details such as specific components and limited examples and drawings, these have been provided only to help a more general understanding of the present disclosure, and the present disclosure is not limited to the above-described examples, and those with ordinary skill in the art to which the present disclosure pertains may make various modifications and variations without departing from the essential characteristics of the present disclosure. Therefore, the spirit of the present disclosure should not be limited to the described examples, and not only the patent claims described below, but also all technical ideas that are equivalent or have equivalent variations to these patent claims should be interpreted as being included in the scope of the rights of the present disclosure.

What is claimed is:

1. A susceptor comprising a ceramic plate having an electrode disposed thereon,
wherein the ceramic plate comprises:
an electrode pad connected to the electrode; and
an electrode rod having one end connected to the electrode pad to supply power to the electrode,
wherein the electrode rod comprises:
an extension part connected to the electrode pad; and
a power connection part disposed at an end of a tapered portion of the extension part,
wherein the extension part including the tapered portion and the power connection part extending therefrom are integrally formed of a single same material.

2. The susceptor of claim 1, wherein the electrode rod comprises a metal nitride film on a surface of a base material.

3. The susceptor of claim 1, wherein the tapered portion is tapered by a machine tool such that the tapered portion is disposed between the extension part and the power connection part having different diameters.

4. The susceptor of claim 1, wherein the tapered portion of the extension part has an inclination angle of 10° to 80° with respect to a longitudinal direction of the extension part.

5. The susceptor of claim 1, wherein the tapered portion of the extension part has a length of 1.0 mm to 10.0 mm in a longitudinal direction of the extension part.

6. The susceptor of claim 1, wherein a smaller-diameter end of the tapered portion of the extension part is positioned such that a temperature thereof is at least 10% lower than a temperature of a lowermost surface of the ceramic plate.

7. The susceptor of claim 1, wherein the end having a smaller diameter in the tapered portion of the extension part is positioned such that a temperature thereof is at least 20% lower than that of the lowermost surface of the ceramic plate.

8. The susceptor of claim 1, wherein the electrode rod comprises a base material made of Mo, W, or an alloy thereof.

9. The susceptor of claim 1, wherein the extension part of the electrode rod comprises a second rod brazed to the electrode pad and a first rod brazed to the second rod.

10. The susceptor of claim 9, wherein the second rod is made of a metal material having a thermal expansion coefficient difference of 3 or less from a material of the electrode pad.

11. The susceptor of claim 1, wherein the electrode comprises a high-frequency electrode, an electrostatic chuck electrode, or a heating element.

* * * * *